United States Patent [19]  [11] 4,164,008
Miller et al.  [45] Aug. 7, 1979

[54] ILLUMINATED ARTICLE OF CLOTHING

[75] Inventors: Garry E. Miller, Los Angeles; Michael Dalke, Shaster, both of Calif.

[73] Assignees: Stanley M. Meyer, Merrick; Barbara Schwartz, Floral Park, both of N.Y.; part interest to each

[21] Appl. No.: 771,750

[22] Filed: Feb. 24, 1977

[51] Int. Cl.² .................. F21V 33/00; A47G 33/16; D06C 15/00

[52] U.S. Cl. .................. 362/103; 362/252; 362/800; 362/806; 223/52

[58] Field of Search .............. 362/103, 104, 108, 800, 362/227, 234, 249, 252, 806, 811; 361/397, 398; 223/51, 52

[56] References Cited

U.S. PATENT DOCUMENTS

| 1,215,389 | 2/1917 | Lauray | 362/103 X |
|---|---|---|---|
| 2,632,093 | 3/1953 | De Merolis et al. | 362/103 |
| 2,962,580 | 11/1960 | Jones | 362/103 |
| 3,499,220 | 3/1970 | Hintz et al. | 361/398 |
| 3,685,179 | 8/1972 | Michaels | 223/2 |
| 3,737,647 | 6/1973 | Gomi | 362/800 X |
| 3,805,047 | 4/1974 | Dockstader | 362/104 |
| 3,818,209 | 6/1974 | Roth | 362/104 |
| 3,836,824 | 9/1974 | Watrons | 361/398 |
| 3,866,035 | 2/1975 | Richey, Jr. | 362/104 |
| 3,882,264 | 5/1975 | Travis | 361/398 X |
| 3,894,225 | 7/1975 | Chao | 362/249 |

Primary Examiner—William M. Shoop
Assistant Examiner—Peter S. Wong
Attorney, Agent, or Firm—Friedman, Goodman & Teitelbaum

[57] ABSTRACT

An illuminated article of clothing including a garment material with a thin, supple, printed circuit sheet fastened to one side of the garment. The printed circuit sheet contains a pattern of electrical pads and interconnections, and supports light emitting devices connected to the pads, where the light emitting devices protrude through the garment. A circuit providing for continuous or intermittent operation of the light emitting devices is connected to the printed circuit sheet by electrical leads. The light emitting devices are illuminated by a source of energy, such as a battery. The circuit and the battery can be stored in a pocket formed in the garment.

14 Claims, 7 Drawing Figures

ILLUMINATED ARTICLE OF CLOTHING

BACKGROUND OF THE INVENTION

This invention relates to display devices and more particularly to an illuminated article of clothing.

With the introduction of small light emitting devices and miniaturized circuitry and fabrication techniques, there has been introduced the use of light emitting devices in connection with various articles of adornment such as jewelry including watches, pendants, and the like. In such jewelry, the light emitting element is positioned in a visable place on the outside of the jewelry and an energizing circuit, including flashing devices or other controlling circuits, are incorporated on a printed circuit board or incorporated within a housing and usually placed directly beneath the light emitting device or at a close location to it. In many such devices the housing for the electronic circuitry forms part of the jewelry structure itself. For example, in an illuminated tie tack, the housing for the electronic circuitry and the battery form the clasp for the tack itself.

The light emitting device is supported either directly by the housing retaining the printed circuit board or is supported by a separate holder which can mechanically restrain the light emitting device and provide electrical connection thereto.

While such light emitting devices have found use in such types of jewelry, it has been impractical to utilize such light emitting devices for articles of clothing because of the hard rigid surface of the structural member supporting the light emitting devices. This is especially true if the light emitting devices are to form a large pattern on the clothing garment either independently of or integrated with a design formed on the garment.

For example, if a large design, such as an animal face, is formed on the front of a tee-shirt, and it is desired to utilize light emitting elements as part of the face design for the eyes, nose, mouth, etc., the area over which the light emitting devices span is quite large. A housing or printed circuit board of the type utilized in connection with jewelry would thus be impractical to attach to the article of clothing. It would make the clothing rigid, heavy, difficult to use and uncomfortable to wear.

Accordingly, the prior art devices have not been useful for providing illuminated articles of clothing, especially when a plurality of light emitting devices are utilized extending over a large surface area of the garment.

SUMMARY OF THE INVENTION

It is therefore an object of the present invention to provide an illuminated article of clothing which avoids the aforementioned problems of prior art devices.

Yet another object of the present invention is to provide an illuminated article of clothing which is supple, even in the area containing the light emitting elements.

A further object of the present invention is to provide an illuminated article of clothing which can be comfortably worn, easily flexed, and which avoids rigid, heavy and hard portions on the garment.

Yet another object of the present invention is to provide an illuminated article of clothing which utilizes a thin, supple, printed circuit sheet supporting light emitting devices, which light emitting devices can protrude through the face of the article of clothing.

Another object of the present invention is to provide an illuminated article of clothing having a thin, supple, printed circuit sheet supporting the light emitting devices, and utilizing an electronic circuit and energy source interconnected to the printed circuit by an extended electrical lead, whereby the energy source and the electronic circuit can be stored in a pocket within the garment.

A further object of the present invention is to provide an illuminating display device for connection to an article of clothing permitting illumination of the article without substantially destroying the supple nature of the clothing.

Still another object of the present invention is to provide a method for assembling an illuminated article of clothing by placing a thin, supple, printed circuit sheet supporting light emitting devices onto the clothing garment.

Another object of the present invention is to provide an apparatus for assembling an illuminated article of clothing.

Briefly, there is provided an article of clothing including a garment material which has a front and rear surface. A thin, supple, printed circuit sheet is utilized which contains a desired circuit pattern. At least one light emitting device is electrically connected to and is supported by the supple printed circuit sheet. Fastening means are utilized to couple the printed circuit sheet to the rear of the garment with the light emitting devices protruding through the garment, whereby the garment maintains its supple characteristics. Circuit means are electrically connected to the printed circuit sheet and are adapted to interconnect to a source of energy for illuminating the light emitting devices.

In an embodiment of the invention, the printed circuit sheet comprises a thin, insulating film, and conductive material is formed thereon which designates mounting pads for the light emitting devices and electrical connections between the light emitting devices. The circuit means comprises a sequential flasher circuit for intermittently operating the light emitting devices, and a housing means for retaining the flasher circuit. Electrical leads interconnect the printed circuit sheet with the flasher circuit. The garment material can include a pocket for holding the housing means.

A method of assembling an illuminated article of clothing is also provided, and includes the steps of forming openings in a garment to accept a pattern of light emitting devices. A thin flexible printed circuit sheet containing the light emitting devices is placed onto the inside of the garment with the light emitting devices protruding through the garment openings, and the printed circuit sheet is fastened to the inside of the garment. An apparatus is also provided for carrying out the assembling method. Also provided in the invention is illuminating means for connection to an article of clothing.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of a preferred embodiment in which.

In the accompanying drawings, like reference characters designate like parts.

DESCRIPTION OF THE PREFERRED EMBODIMENTS

Figure 1:
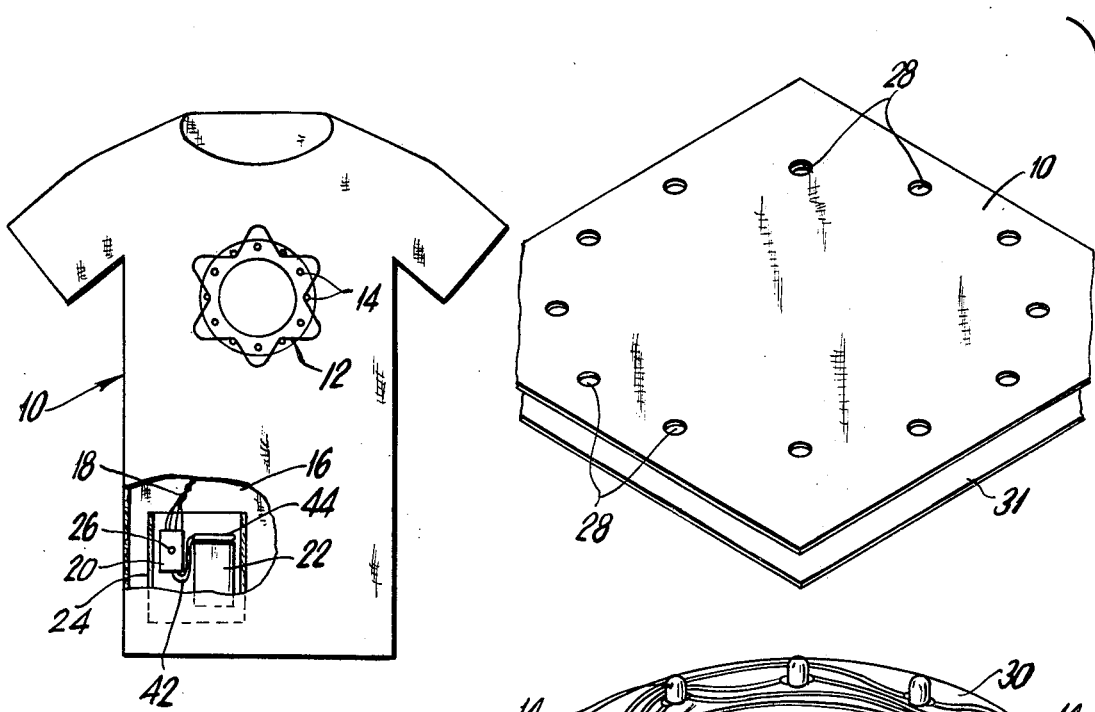
FIG. 1 is a partially cut-away schematic drawing of an illuminated article of clothing in accordance with the present invention.

Referring now to FIG. 1 there is shown an article of clothing 10, in the form of a tee-shirt, and including a design 12 formed on the front of the shirt and having light emitting devices 14 in the form of light emitting diodes which protrude through the front of the garment. The diodes are integrated into the pattern 12 to form a unitary design.

Through the cut-away portion 16 there can be seen electric leads 18 extending from behind the light emitting diodes and interconnecting to a housing 20 which contains the electronic circuit, and to which is connected an electrical energy source, shown as battery 22. The housing 20 and battery 22 are shown placed in a pocket 24 which can be formed either on the inside or the outside of the garment 10, and either on the front or the back of the garment. A switch 26 is formed on the housing 20 which interconnects the energy source 22 to the illuminating diodes 14. If the electronic circuit in the housing 20 includes a flasher, then the light emitting devices will be intermittently energized either sequentially or randomly, depending upon the circuit. On the other hand, the electronic circuit 24 could provide continuous operation of all of the light emitting devices. Additionally, a timing circuit can be included whereby the light emitting devices will be illuminated intermittently or continuously for a predetermined amount of time following energization by the switch 26. Following that period of time, the source of energy will be automatically disconnected turning off the light emitting devices. With a timer circuit, the switch 26 would be of the momentary closure type switch.

Figure 2:
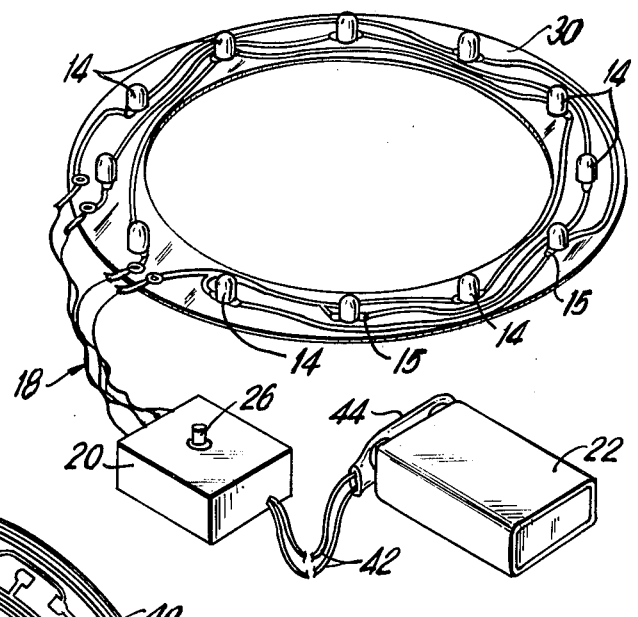
FIG. 2 is an exploded view of the elements forming the illuminated article of clothing.

Referring now to FIG. 2 there is shown the various parts forming the illuminated article of clothing. The garment 10 contains apertures 28 which are preformed in the garment to receive the light emitting devices. The light emitting devices 14 are electrically connected onto connecting pads 15 formed on a thin, supple, printed circuit sheet 30 having the electrical printed circuit 32 formed thereon.

The printed circuit is formed of very thin insulating film material, such as a Mylar, with a conductive pattern formed thereon. By way of example, the film can be a stable sheet of Mylar film clad with two mills thickness of copper. The copper can be photographically etched to produce the desired printed circuit pattern including the mounting pads and electrical interconnections for the light emitting devices. The light emitting devices can then be soldered and/or welded in place onto the pads.

Figure 3:
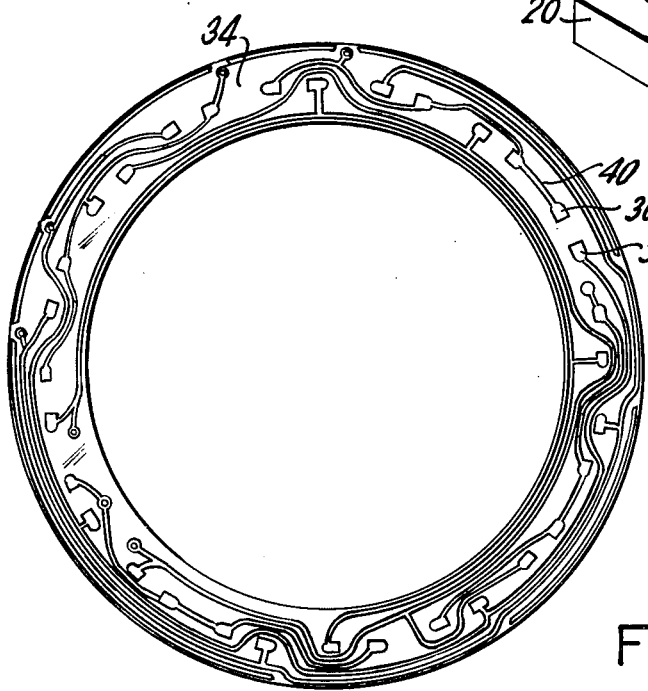
FIG. 3 shows an embodiment of the supple, printed circuit sheet.

By way of example, there is shown in FIG. 3 a thin, supple, printed circuit sheet including the Mylar film 34 with the pads 36 and 38 available for interconnection therebetween of a light emitting device. Other such pads are also formed on the Mylar film. Electrical interconnections 40 interconnect the various light emitting devices in accordance with a predetermined desired pattern.

The thin, supple, printed circuit sheet can be cut to various sizes and shapes in accordance with the desired pattern of the illuminating light emitting devices. Because of its flexible, pliant, and supple nature, it can be connected to the garment wherein the garment will still retain its own typical flexible properties which are characteristic of articles of clothing. By way of example the pattern shown in FIG. 3 is a circle which would accommodate 12 light emitting devices placed in a circular arrangement.

Referring again back to FIG. 2, a layer of adhesive material 31 such as a type responsive to heat and pressure, can be placed over the surface of the printed circuit sheet. By application of heat and pressure the printed circuit sheet 30 can be interconnected to the rear of the garment 10 with the light emitting devices 14 protruding through the apertures 28. The adhesive material 31 could be cut to the shape of the printed circuit or could also have preformed cut outs for the light emitting devices. Alternatively, the adhesive material could be placed on the back side of the printed circuit sheet and covered thereby connecting it to the garment.

The leads 18 extend from the printed circuit to the housing 24 containing the electronic circuit for controlling the operation of the illuminating device and having switch 26. Battery leads 42 are shown connected to the housing 24 which couple to a battery connector 44 to which is connected the battery 22. Both the battery 22 and the housing 24 can be placed within a pre-established pocket in the garment. Alternately, it can be placed in any other pocket available to the wearer. Furthermore, it could be clipped or hooked onto the garment without the need of any pocket at all.

Figure 4:
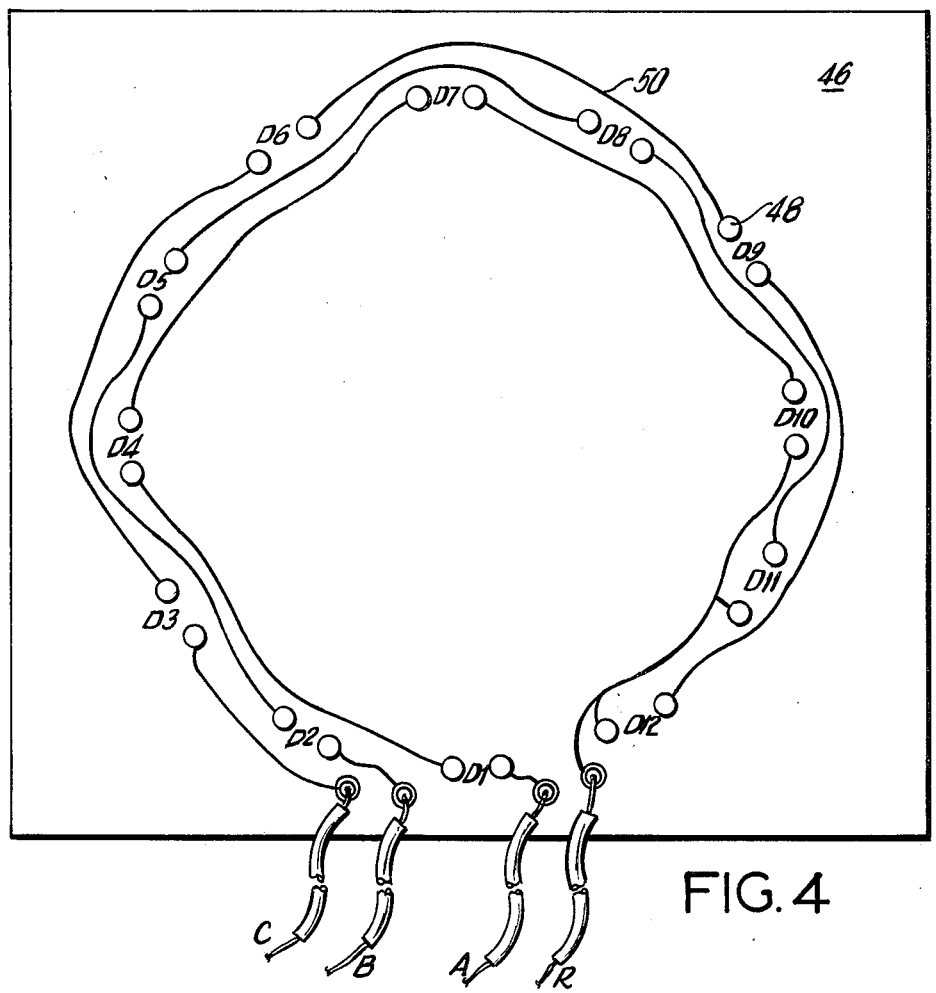
FIG. 4 is an electrical schematic of the printed circuit sheet shown in FIG. 3.

The electrical arrangement for the printed circuit sheet is shown in detail in FIG. 4. The thin film of material 46 contains on it appropriate electrical connections to form the pads 48 to which are connected light emitting devices. Interconnecting leads 50 are available for interconnecting respective ones of the illuminating light emitting devices. In the circuit shown, a total of 12 light emitting devices can be connected, designated D1-D12. The light emitting devices are connected with groups of 4 in series to form three strings of four lights each. Specifically, diodes D1, D4, D7 and D10 are serially interconnected between one electric lead A and a common return lead R. Diodes D2, D5, D8 and D11 are also serially interconnected in a single string and placed between the lead B and the common return R. The third string includes diodes D3, D6, D9 and D12 connected between the lead C and the return R.

Figure 5:
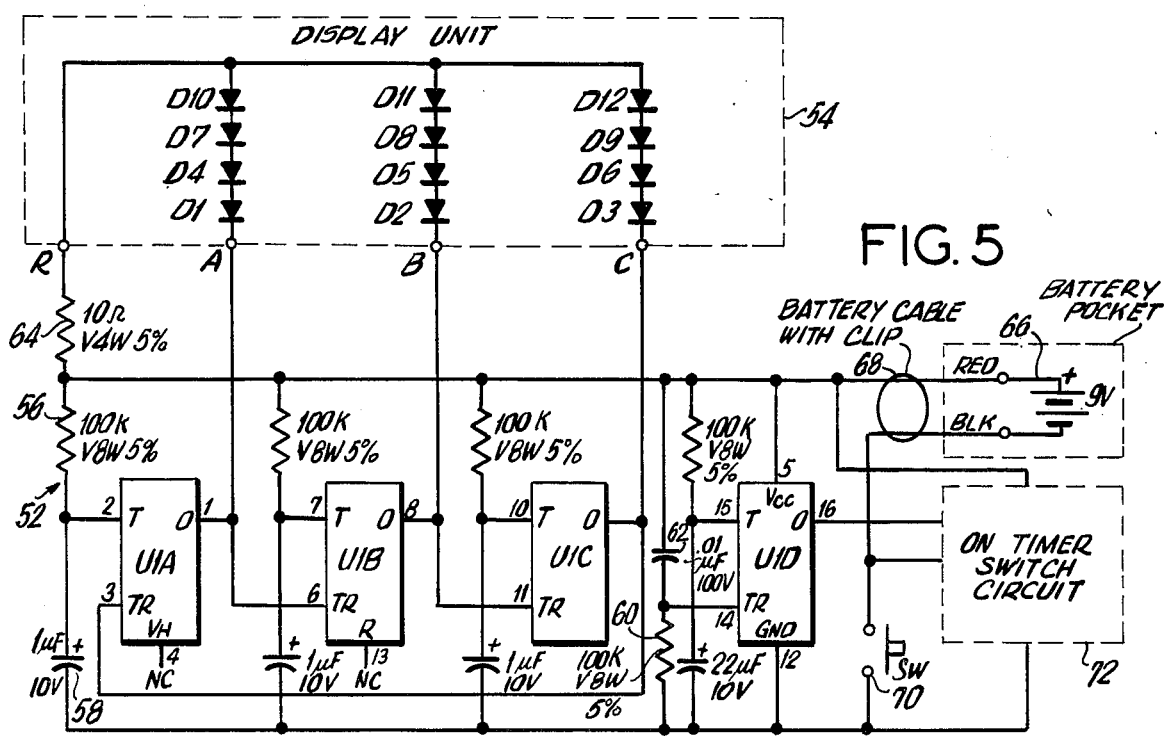
FIG. 5 is a circuit diagram of an electronic flasher circuit.

Referring now to FIG. 5, there is shown a sequential electronic flasher unit 52 which provides intermittent operation of the three strings of diodes. The three strings described in connection with FIG. 4 are shown generally as the display unit 54 which shows the serial interconnections as well as the cable leads A, B, C and R.

A quad timer integrated circuit is utilized and is designated as U1. The four sections thereof are respectively associated with the leads A, B, C and R and are designated as U1A, U1B, and U1C. The fourth section U1D is utilized for the intermittent operation and interconnection to the battery source. Resistors 56 and capacitors 58 are connected across the time delay input to each section of the timer. The timer sections are interconnected so the output of one section feeds the trigger of the next section to provide the sequential operation of the three series sections of light emitting devices. An additional resistor 60 in series with capacitor 62 is provided as the trigger input of the fourth section of the timer. A battery supply is supplied to the Vcc terminal of the fourth section. A resistor 64 serially interconnects the return cable R to the timer.

By way of example, a Signetics integrated circuit NE553BA was utilized, which provided the three way sequential pattern at an exceedingly rapid rate. By spacing the series of diodes in sequence, as is shown in FIG. 4, there can appear a rapidly changing pattern of illumination which simulates a random effect and/or a sequential chase-like effect.

A 9 volt battery 66 is utilized and is interconnected by means of the battery clip 68. A momentary switch 70 is integrally included with the quad timer circuit. A timing switch circuit 72 is also utilized. After the momentary switch 70 is connected, the timing switch circuit 72 will disconnect the battery from the rest of the circuit after a predetermined fixed amount of time.

Figure 6:
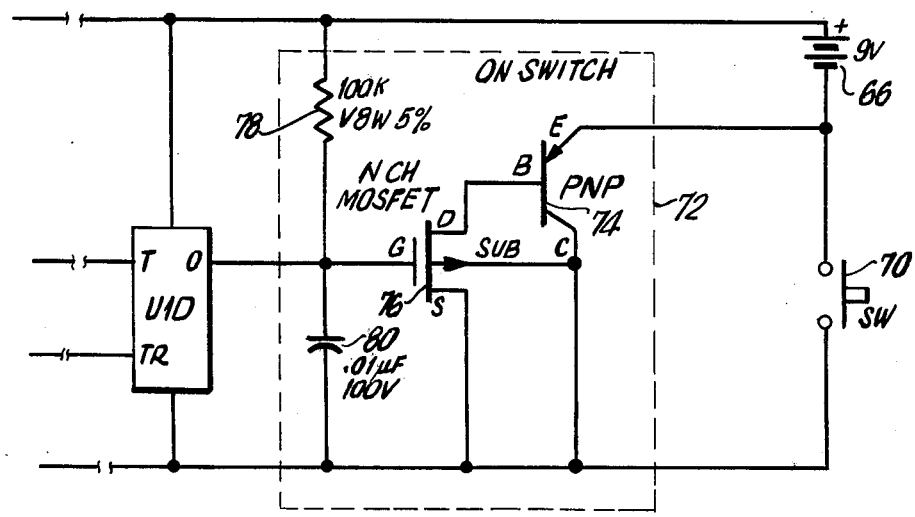
FIG. 6 is a schematic diagram of an electric timing circuit.

Referring to FIG. 6, the timer circuit 72 is shown to include a PNP bipolar transistor 74 designed for low voltage during its on state and with low leakage current at off. The emitter of transistor 74 is connected between the switch 70 and the battery 66 and the collector is connected to the opposite end of the switch. The base of the transistor is connected to the drain of an N channel metal oxide silicon field effect transistor 76 designed for very low source to drain current and with zero gate to source voltage. The source of the Mosfet is connected to the collector of the transistor. The gate of the Mosfet is connected to the output of the fourth section of the quad timer. A resistor 78 and capacitor 80 are connected across the gate.

When the momentary switch 70 is closed, the capacitor charges towards the 9 volts of the battery supply 66. The capacitor maintains the circuit operative for a predetermined fixed period of time even after the switch is open, following which the circuit is de-energized. As a result of utilizing the timing circuit 72, it is not required to disconnect the battery during normal use since there is virtual shelf life drain when the switch is not activated.

The circuit shown in FIGS. 5 and 6 can be placed on a single printed circuit board of conventional type and can be made exceedingly small, as for example 1½″ by 1½″ by ¼″, and placed in a housing. The housing can be placed in a small pocket together with the 9 volt battery.

Although the electronic circuit described was for a sequential timer, other types of electronic circuits can be utilized to provide continuous operation, fully random operation or a simulated quasi-sequential chase-like operation. Additionally, individual intermittent operation of each diode can also be provided with an electronic circuit.

The illuminated article of clothing as described can be assembled in the following manner. The garment is initially preholed to accept the light emitting devices. The supple, printed circuit sheet is then placed on the inside of the garment material. The light emitting devices can be positioned to protrude through the preholed arrangement. Using a heat sensitive adhesive on the flexible circuit, pressure can be applied simultaneously with heat, from both the bottom and the top, to fasten the printed circuit to the garment.

In addition, it is possible to transfer a graphic pattern to the front surface of the garment in conjunction with the integrated light emitting devices. As the graphic pattern is applied to the garment the heat and pressure applied to transfer the graphic onto the garment is also utilized to attach the printed circuit sheet to the garment. However, it must be remembered that the press or other device applied from the top must contain cavities to accommodate the protruding light emitting devices thereby preventing crushing of the light emitting devices when pressure is applied. The graphic pattern serves to integrate the light emitting devices into the design and also secures the lights with the garment in a permanent base.

Figure 7:
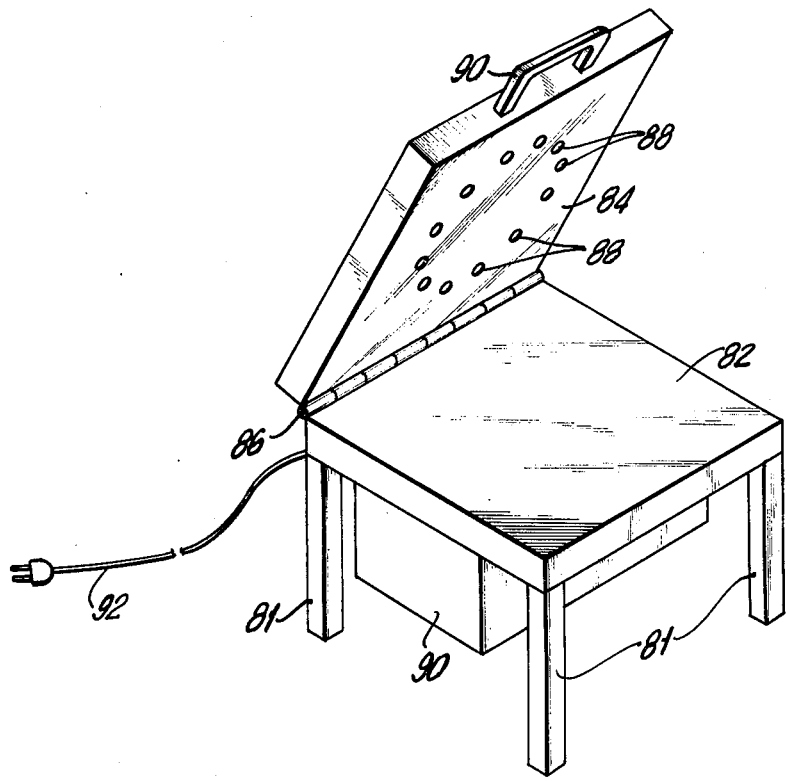
FIG. 7 is a perspective view of an apparatus useful for assembling the illuminated article of clothing, in accordance with the present invention.

Referring to FIG. 7, there is shown a simplified apparatus which can be utilized to carry out the method heretofore described. There is shown a support 81 containing a bottom plate 82 on which the flexible printed circuit sheet is placed and the garment placed over it. A cover 84 is pivoted at 86 to rotate and close onto the base surface 82. Cavities 88 are formed in the upper plate 84. A control circuit 90 is provided for the application of heat and pressure. A plug 92 is available for connection to a source of electrical energy. In operation, the garment with the printed circuit sheet and the heat sensitive adhesive are all placed on the bottom surface 82. The top surface is closed onto the combination permitting the light emitting device to protrude into the cavities 88. By means of the handle 90, the two parts of the press 82, 84 are held together while heat and pressure are applied to fasten the printed circuit sheet to the garment.

Simultaneously, utilizing the apparatus of FIG. 7 a graphic pattern can also be placed onto the top surface of the garment.

The technique of the present invention eliminates the need for the art known "litz" wire approach for flexibility. The flexible printed circuit sheet or board is trouble free and capable of a lifetime of unlimited flexes thereto.

Although an adhesive surface has been described in connecting the printed circuit sheet to the garment, other types of attachments could be utilized for either permanent or temporary connection. For example, to provide a temporary connection Velcro material can be cemented, stitched or heat bonded to the garment and the printed circuit sheet. Alternately, snaps, the nature of which would blend with the pattern, could also be utilized. For permanent connection the printed circuit sheet could be cemented, stitched, heat bonded, or other well known type of attachments could be utilized.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:
1. An article of clothing comprising:
 (a) a garment material having front and rear surfaces;
 (b) a single thin supple, printed circuit sheet, said printed circuit sheet being a film of insulating material providing mounting pads and electrical interconnections therebetween;

(c) a plurality of light emitting devices electrically connected directly to said mounting pads and supported by said printed circuit sheet;

(d) adhesive means integrally coupling said printed circuit sheet to the rear of said garment material with only said light emitting devices protruding through said garment material to the front surface thereof whereby said garment material will retain its flexible characteristics, and (e) circuit means separate from and electrically connected to said printed circuit sheet and adapted to interconnect to a source of energy for illuminating said light emitting devices.

2. An article of clothing as in claim 1, wherein said printed circuit sheet comprises a thin sheet of Mylar film clad with photo-etched cooper to form said circuit pattern.

3. An article of clothing as in claim 1, wherein said circuit means comprises a sequential flasher circuit for intermittently operating said light emitting devices, a housing means for retaining said flasher circuit, and electric leads interconnecting said printed circuit sheet with said flasher circuit.

4. An article of clothing as in claim 3, wherein said garment material further comprises pocket means formed therein for holding said housing means.

5. An article of clothing as in claim 3, wherein said circuit means further comprises a timing circuit for de-energizing said flasher circuit after a predetermined period of time following energization thereof.

6. An article of clothing as in claim 3, wherein said sequential flasher circuit comprises a printed circuit board, a quad timer integrated circuit mounted on said printed circuit board, battery mounting terminals, a switch connected to said integrated circuit and mounted on said printed circuit board, and battery leads connected between said battery mounting terminals and said switch.

7. An article of clothing as in claim 6, wherein said circuit means further comprises a timing circuit including a field effect transistor having a control electrode and a main flow path, said control electrode connected to the output of said quad timer, a transistor having a control terminal and a flow path, the transistor control terminal coupled in the main flow path of said field effect transistor and the transistor flow path connected to said switch.

8. An article of clothing as in claim 1, wherein said garment material contains a decorative pattern on the front surface thereof, and wherein said light emitting devices form an integral part of said decorative pattern.

9. A method of assembling an illuminated article of clothing, comprising the steps of:

(a) forming openings in a garment to accept a pattern of light emitting devices;

(b) placing on the inside of the garment a single thin, supple, printed circuit sheet formed of a film of insulating material containing a desired circuit pattern of conductive material providing mounting pads and electrical interconnections therebetween, and a plurality of light emitting devices electrically connected directly to the mounting pads, with only the light emitting devices protruding through the garment openings, and (c) fastening the thin, supply, printed circuit sheet to the inside of the garment by means of an adhesive to securely support the light emitting devices while still maintaining the flexible characteristics of the garment.

10. A method as in claim 9, wherein said step of fastening further comprises the steps of coupling a heat sensitive adhesive over the thin printed circuit sheet, and applying heat and pressure against the garment and printed circuit sheet to integrally adhere the sheet to the garment.

11. A method as in claim 10, wherein said step of fastening further comprises the steps of placing the printed circuit sheet and garment in an apparatus for applying the heat and pressure, and locating the light emitting elements in registration holes in the apparatus.

12. A method as in claim 11, wherein said step of fastening further comprises the steps of placing a pattern on the outside surface of the garment, said pattern serving to integrate the light emitting devices as part of the pattern design.

13. A method as in claim 9, wherein said step of placing further comprises the steps of selecting a metal clad thin film sheet, etching the metal to leave a printed circuit of electrical pads and interconnections, and electrically connecting the light devices to the pads.

14. Apparatus for assembling an illuminated article of clothing comprising: garment holding means for retaining the garment during assembly; means for holding a thin, supple, printed circuit sheet containing light emitting devices; fastening means for fastening the thin, printed circuit sheet against the garment with the light emitting devices protruding through the garment; means in said garment receiving means for accommodating the protruding light emitting devices during assembly; said fastening means including a heat sensitive adhesive positioned over the printed circuit sheet, and further comprising means for applying heat and pressure to connect the printed circuit sheet to the garment.

* * * * *